United States Patent

Hsieh

[11] Patent Number: 6,053,242
[45] Date of Patent: Apr. 25, 2000

[54] HEAT SINK ASSEMBLY

[75] Inventor: Hsin-Mao Hsieh, No. 6, East Section, Chiao Nan Li, Industrial 6th Rd., Pingtung City, Pingtung Hsien, Taiwan

[73] Assignee: Hsin-Mao Hsieh, Pingtung, Taiwan

[21] Appl. No.: 09/266,609

[22] Filed: Mar. 11, 1999

[51] Int. Cl.[7] .................................................. H05K 7/20
[52] U.S. Cl. ......................... 165/121; 165/80.3; 361/697
[58] Field of Search ................................ 165/80.3, 121, 165/122, 185; 361/697, 704

[56] References Cited

U.S. PATENT DOCUMENTS

| | | | |
|---|---|---|---|
| 5,309,983 | 5/1994 | Bailey | 165/80.3 |
| 5,377,745 | 1/1995 | Hsieh | 165/80.3 |
| 5,582,506 | 12/1996 | Hong | 415/177 |
| 5,677,829 | 10/1997 | Clemens | 361/697 |
| 5,943,209 | 8/1999 | Lin | 361/695 |

Primary Examiner—Allen Flanigan
Attorney, Agent, or Firm—Fei-Fei Cho; Venable, Baetjer, Howard & Civiletti, LLP

[57] ABSTRACT

A heat sink assembly has a finned plate, a fan, a plate detachably engaged with the finned plate and provided with a hole defined in the central portion thereof, a shoulder integrally and downwardly formed along the underside of the edge defining the hole and a seat integrally formed on a lower side thereof; and a support member having a disk-like member defining therein a hole to receive the rotor shaft of the fan, a plurality of legs extending outwardly from the disk-like member, each having a bend extending upward from the free end thereof and a contact face formed on the free end of the bend and detachably engaged to the lower side of the plate, at least one support being detachably engaged between the seat of the plate and the finned plate and extending outward from the disk-like member. The support has a stepped structure formed on the free end thereof for the purpose of receiving electrical wires from the fan.

4 Claims, 6 Drawing Sheets

HEAT SINK ASSEMBLY

BACKGROUND OF THE INVENTION

1. Field of the Invention

The present invention relates to a heat sink assembly, and more particularly to a heat sink assembly which has at least one leg extending outward and having a stepped head formed on a free end thereof. A channel is defined in the stepped head for the purpose of receiving electrical wires of a fan, such that the electrical wires are protected from damage and are therefore securely fixed therein.

2. Description of Related Art

Heat transfer is an important factor to performance of integrated circuits. Although a wide variety of cooling devices have been provided before, the results have not been satisfactory in all aspects. For example, the U.S. Pat. No. 5,309,983 issued to Bailey on May, 10, 1994 discloses a heat dissipating device comprising a motorized fan assembly which occupies a relatively large volume and thus cannot be used in portable computers. U.S Pat. No. 5,582,506 discusses a fan device for an integrated circuit, which avoids accumulation of dust and the like. The fan device, as shown in FIGS. 5 and 6 generally comprises a plate (1) with fins; a fan (2); and a board member (3) securely mounted to the plate (1) and including a hole (30) defined in the central portion thereof, a disk-like support member (32) provided in the hole (30), and a plurality of legs (31) extending downwardly from the edge of the surface defining the hole (30) and bending toward and converging with the disk-like support member (32), the support member (32) including a stud (33) extending outward and centrally defined therein a hole (not numbered) for rotatably receiving the rotor shaft (21) of the fan (2). One of the plurality of legs (31) has a groove (311) defined therein, such that an electrical wire connected to the power source and the fan (2) is able to be received in the groove (311) when assembled.

However, such a fan device still has several shortcomings. For example, a user will have to hold the electrical wire to align with the groove (311) then assemble the board member (3) provided with the fan (2) mounted thereon onto the finned plate (1), which increases the difficulty of assembly. Because alignment between the electrical wire and the groove (31) needs the user's continuous care and to keep the wire in the groove (311) also needs the user to hold the wire until the board member (3) and the finned plate (1) are assembled. Furthermore, when the fan (2) is in operation, the air flow (indicated by the arrows in FIG. 7) generated by the fan (2) and flowing outward will be restricted by the outer fins on the finned plate (1). The restricted air flow will further interfere with the air flow generated by the fan (2), such that the heat dissipation effect of the fan device is reduced.

It is an objective of the present invention to provide an improved heat sink assembly to mitigate and/or obviate the aforementioned problems.

Hereinafter, the detailed description of the preferred embodiment of the invention with reference to the accompanying drawings will be given to show the structure and function thereof. However, all the description and reference drawings are used as a descriptive purpose only, but not in a limit sense.

SUMMARY OF THE INVENTION

The main object of the present invention is to provide a heat sink assembly having a finned plate, a support member detachably mounted onto the finned plate, a fan mounted on the support member and a plate securely connected with the finned plate for positioning the fan and the support member therebetween.

Another object of the present invention is to provide a heat sink assembly, which has at least two legs extending outwardly each having a contact face formed on the distal end thereof and received between the underside of the plate and a space between two adjacent fins and a support extending out therefrom and having a stepped structure formed on the free end thereof to be received in a space in the finned plate. With such an arrangement, the electrical wire is securely and easily received in the stepped structure.

A further object of the invention is to provide an improved heat sink assembly having an annular flange formed on the edge defining the hole in the plate. With the provision of the annular flange, the air flow generated by the fan will no longer be restricted because the annular flange blocks any reversed air flow caused by the outer fins of the finned plate. Therefore, the heat dissipation effect of the invention is greatly improved.

Other objects, advantages and novel features of the invention will become more apparent from the following detailed description when taken in conjunction with the accompanying drawings.

DETAILED DESCRIPTION OF THE PREFERRED EMBODIMENT

Figure 1:
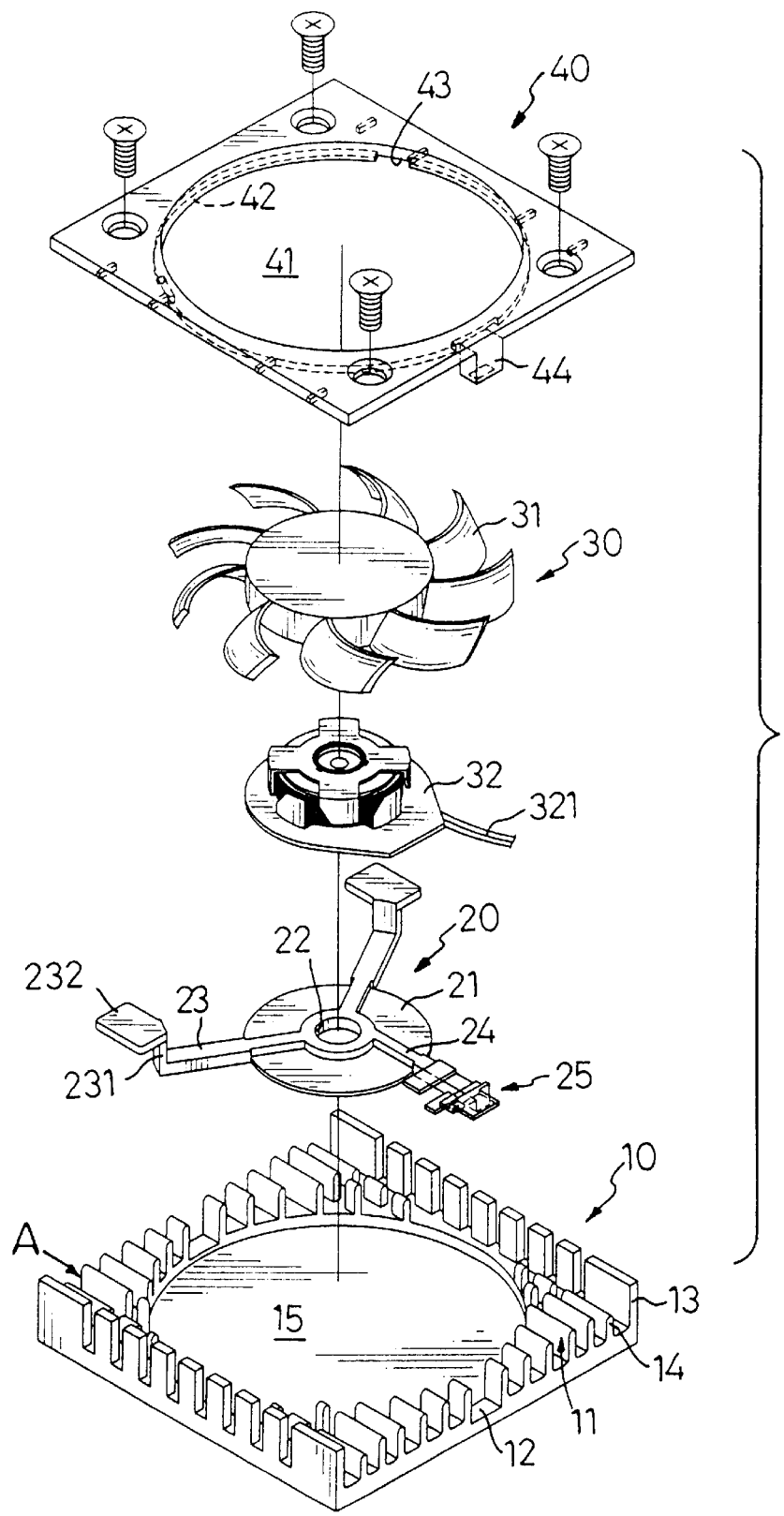
FIG. 1 is an exploded perspective view of a heat sink assembly in accordance with the present invention.

Referring to FIG. 1, a heat sink assembly constructed in accordance with the present invention comprises a finned plate (10), a support member (20) detachably seated on the finned plate (10), a fan assembly (30) mounted on the support member (20) and a plate (40) attached to the finned plate (10) with screws or bolts so as to secure the support member (20) and the fan device (30) therebetween.

The finned plate (10) has a plurality of first fins (11) formed thereon, a pair of recesses (12) defined on opposite sides of the plate (10), two rows of fins forming walls (13) on opposite edges of the plate (10), a row of second fins (14) formed between one of the walls (13) and the firstced fins (11) with a length shorter than that of the first fins (11) and the walls (13). A path A is thereby defined between the first fins (11) and the wall (13). A central hole (15) is further defined in the finned plate (10).

Figure 2:
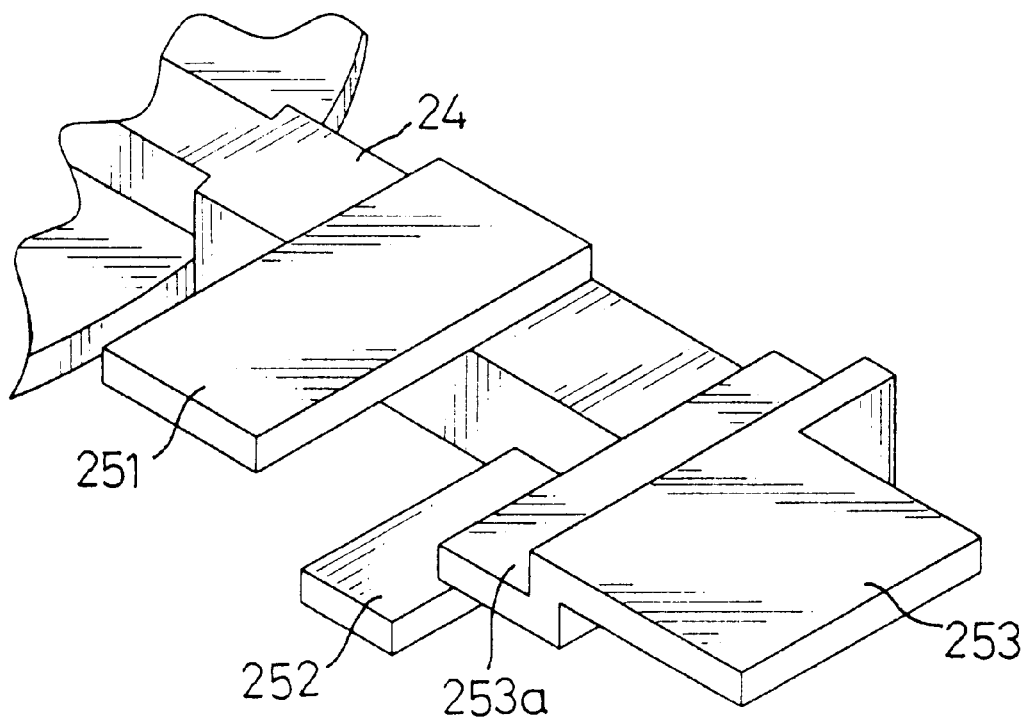
FIG. 2 is a partial enlargement of the end portion of the support.

The support member (20) has a disk-like member (21), a hole (22) defined in the center of the disk-like member (21), at least two legs (23) divergently extending out therefrom and each having an upward bend (231) and a contact face (232) formed on the free end of the upward bend (231) and a support (24) divergently extending out therefrom and having a stepped structure (25) formed on the free end thereof. Referring to FIG. 2, the stepped structure (25) of the invention has a first plate (251), a second plate (252) and a positioning plate (253) integrally formed on the free end of the support (24). The contact face (232) of the leg (23) has a width slightly smaller than the width of path A of the finned plate (10), such that the contact faces (232) of both legs (23) are able to be seated in the paths A in the finned plate (10). Furthermore, the positioning plate (253) is so configured that it is able to be press fit into the recess (12) of the finned plate (10), which allows the disk-like member (21) to be received in the central hole (15). With reference to FIG. 2 again, the first plate (251) and a second plate (252) are located in different planes and the positioning plate (253) has a section (253a) formed in the same plane as the first plate (251).

The fan assembly (30) has a fan (31), an actuator (32) for rotating the fan (31) and an electrical wire (321) extending out therefrom. The fan (31) together with the actuator (32) is able to be mounted in the hole (22) of the disk-like member (21) so as to enable the fan (31) to rotate with respect to the support member (20). It is to be noted from FIG. 1 that the actuator (32) is mounted on top of the hole (22) and the fan (31) is then rotatably mounted on top of the actuator (32).

The plate (40) being bolted or screwed to the finned plate (10) has a centrally defined hole (41), an annular flange (42) formed around the edge defining the hole (41), a plurality of spaced cutouts (43) defined along the annular flange (42) with each corresponding to one of the contact faces (232) of the support member (20) and a seat (44) formed to correspond to the positioning plate (253) of the support member (20) and the recess (12) of the finned plate (10). With such an arrangement, the support member (20) is able to be sandwiched between the plate (40) and the finned plate (10) with the fan device (30) and the actuator (32) mounted on the support member (20).

Figure 3:
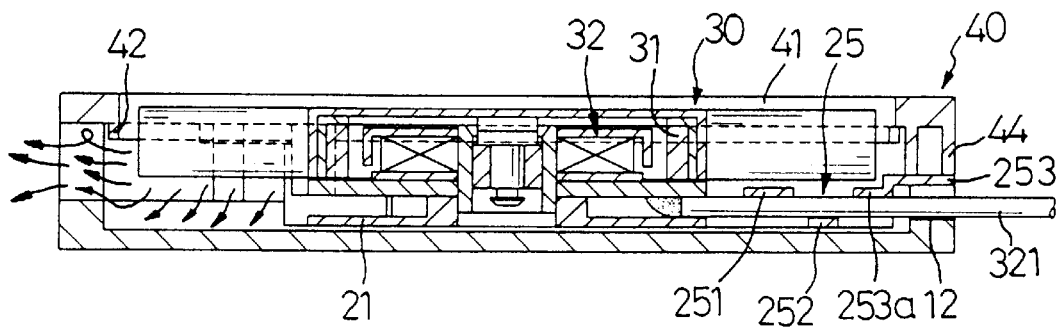
FIG. 3 is a schematic cross sectional view showing the assembled heat sink assembly and the simulated air flow generated by a fan of the invention.
Figure 4:
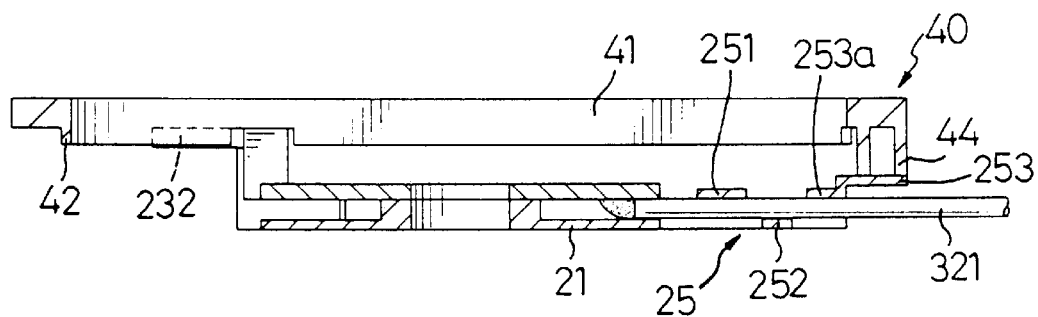
FIG. 4 is a side view of the assembly in FIG. 1 showing the electrical wire being securely held by the end portion of the support.
Figure 5:
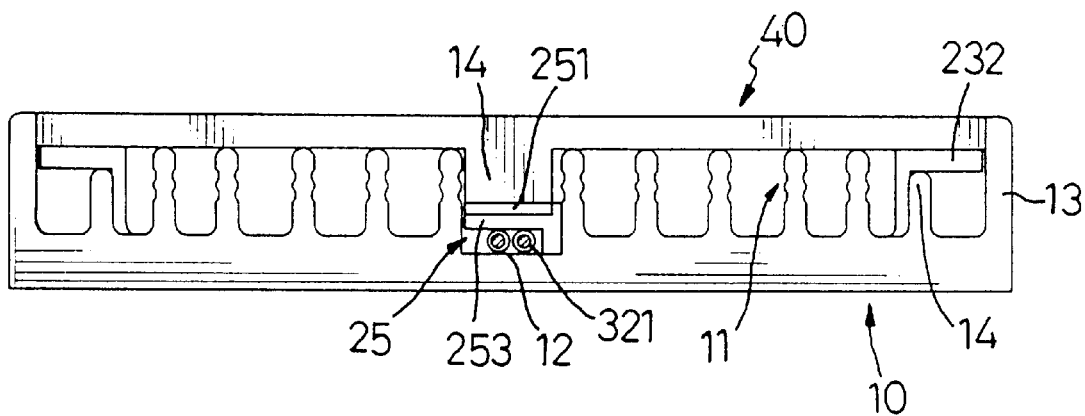
FIG. 5 is a schematic view showing the assembly of the plate with a support member.
Figure 6:
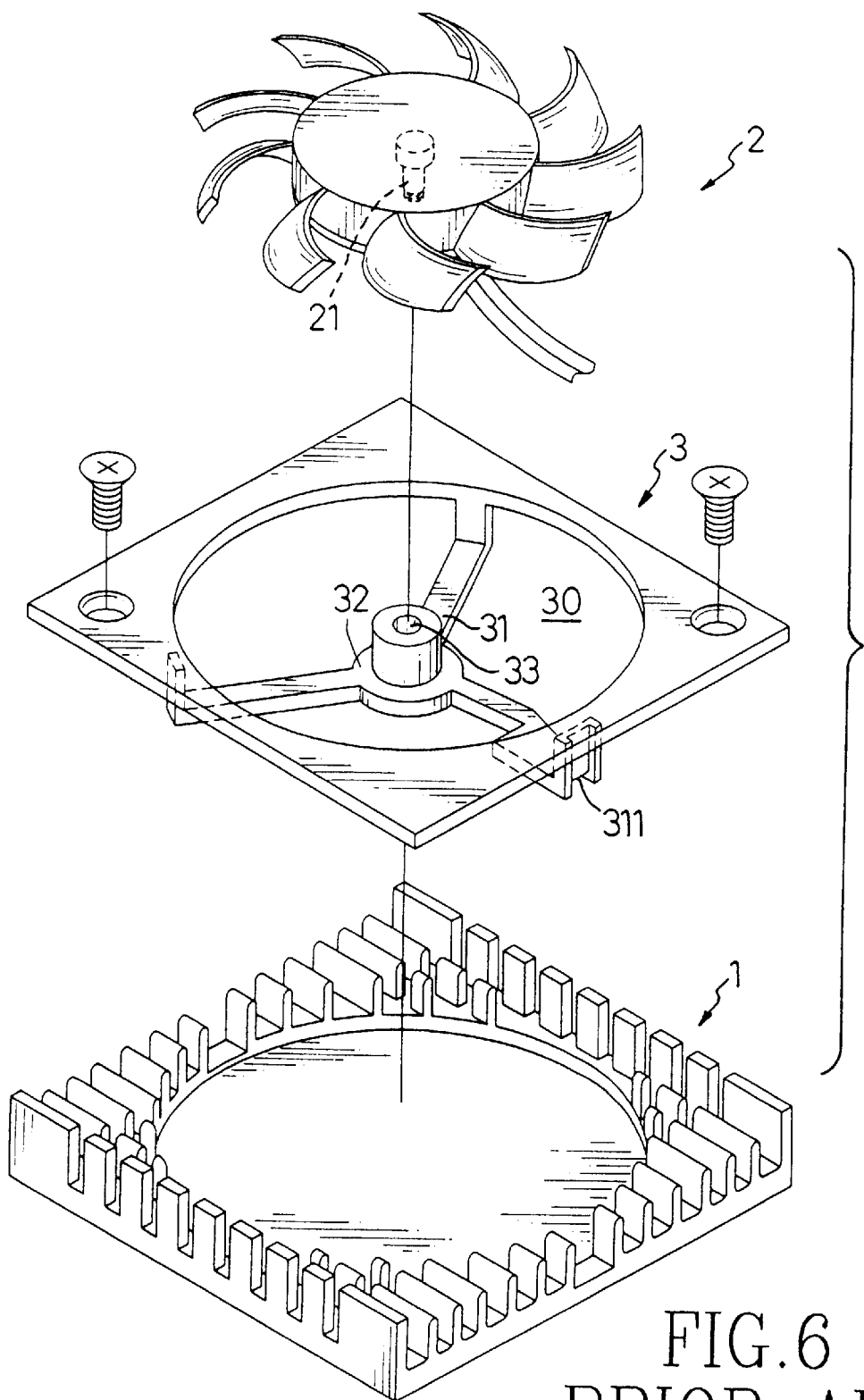
FIG. 6 is an exploded perspective view of a conventional heat sink assembly.
Figure 7:
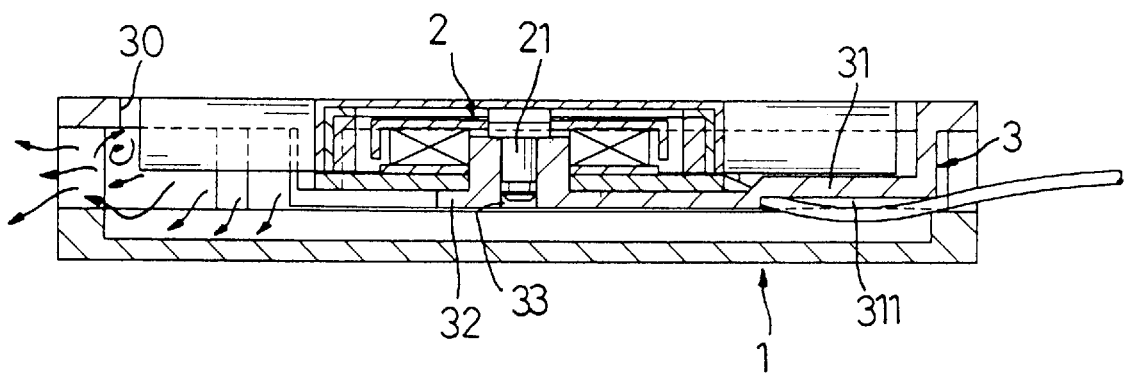
FIG. 7 is a schematic view of the assembly of FIG. 6 and shows the simulated air flow generated by the fan thereof.

Referring to FIG. 3, when the heat sink assembly is assembled, the air flow (indicated by the arrows) generated by the fan blades (31) is directed by the flange (42) of the plate (40) in a direction not to interfere with the cooling effect of the fan blades (31). With reference to FIGS. 4 and 5, when the assembly is in use, the electrical wire (321) of the actuator (32) is securely received between the first plate (251), the second plate (252) and the section (253a) of the positioning plate (253).

It is therefore notable that the invention has the following advantages:

1. easy assembly
2. stronger cooling effect
3. secured placement of the electrical wire Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:

a finned plate having a plurality of first fins formed thereon, at least one recess, two rows of fins forming walls on opposite sides of the plate, a row of second fins which are formed between one of the walls and the first fins and a central hole;

a support member having a disk-like member, a hole centrally defined therein, at least two legs divergently extending out therefrom each having an upward bend and a contact face formed on a free end of the upward bend to be fitted between the first fins and the wall and a support divergently extending out therefrom and having a stepped structure formed on a free end thereof and corresponding to the recess of the finned plate so as to be seated thereon;

a fan mounted on the disk-like member of the support member and having fan blades, an actuator for rotating the fan blades and an electrical wire extending out therefrom; and a plate detachably secured to the finned plate and having a centrally defined hole, an annular flange formed around the edge defining the hole, a plurality of spaced cutouts defined along the annular flange and each corresponding to one of the contact faces of the support member and a seat formed to correspond to the stepped structure of the support member and the recess of the finned plate.

2. The assembly as claimed in claim 1, wherein the second fins have a length shorter than those of the first fins and the walls.

3. The assembly as claimed in claim 1, wherein the stepped structure has a first plate, a second plate integrally formed on the support and a positioning plate formed on a free end of the support and having a section formed to be in the same plane as the first plate;

the positioning plate being so configured that it is able to be press fit into the recess of the finned plate.

4. The assembly as claimed in claim 3, wherein the first plate and the second plate are located in different planes.

* * * * *